US006787456B1

(12) United States Patent
Kripesh et al.

(10) Patent No.: US 6,787,456 B1
(45) Date of Patent: Sep. 7, 2004

(54) WAFER-LEVEL INTER-CONNECTOR FORMATION METHOD

(75) Inventors: Vaidyanathan Kripesh, Singapore (SG); Mahadevan K Iyer, Singapore (SG); Ranganathan Nagarajan, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 1 day.

(21) Appl. No.: 10/392,084

(22) Filed: Mar. 20, 2003

(51) Int. Cl.[7] .................. H01L 21/4763; H01L 21/311; H01L 21/31; H01L 21/469; H01L 21/26
(52) U.S. Cl. ..................... 438/638; 438/700; 438/780; 438/781
(58) Field of Search ................. 438/638, 700, 438/780, 781, 623; 430/18, 315

(56) References Cited

U.S. PATENT DOCUMENTS

| 6,268,015 B1 | 7/2001 | Mathieu et al. ............... 427/96 |
| 2003/0127740 A1 * | 7/2003 | Hsu et al. .................... 257/758 |

* cited by examiner

Primary Examiner—W. David Coleman
Assistant Examiner—William M. Brewster

(74) Attorney, Agent, or Firm—Nath & Associates PLLC; Harold L. Novick; Derek Richmond

(57) ABSTRACT

Inter-connectors are typically used for interconnecting electronic components. Interconnections between electronic components are generally classified into at least two broad categories of "relatively permanent" and "readily demountable". A "readily demountable" connector includes a spring-like contact structure of one electronic component for connecting to a terminal of another electronic component. The spring-like contact structure, also known as an inter-connector, generally requires a certain amount of contact force to effect reliable pressure contact to a terminal of an electronic component. Therefore, the shape and metallurgy of the inter-connector are important factors in determining the effectiveness of the inter-connector for making pressure connection to a terminal of the electronic component. Conventional methods of making such an inter-connector use lithographic and planarisation methods to "make" the inter-connectors in segments. This results in the inter-connector segments having joints therebetween. Metallurgically, the joint stress due to joining a pair of inter-connector segments and stress concentration at the joints due forces applied to the inter-connector can lead to the mechanical failure of the inter-connector in Mathieu. An embodiment of the invention uses lithographic techniques and heat treatment methods for forming a structure channel defining the shape and dimension of an inter-connector. The structure channel is then used to "mold" a reproduction of the inter-connector having a single continuous physical segment.

29 Claims, 21 Drawing Sheets

WAFER-LEVEL INTER-CONNECTOR FORMATION METHOD

FIELD OF INVENTION

The present invention relates generally to an inter-connector formation method. Specifically, the present invention relates to an inter-connector formation technique for forming an inter-connector for interconnecting two electronic components.

BACKGROUND

Inter-connectors are typically used for interconnecting electronic components, for example, devices on circuit boards or circuits on integrated circuit chips. The inter-connectors may be further used for interconnecting an integrated circuit chip and a device.

Interconnections between electronic components are generally classified into at least two broad categories of "relatively permanent" and "readily demountable". An example of a "relatively permanent" connector is, for example, a wire bond. The use of a wire bond for interconnecting two electronic components requires a contact element or "wire" element to be bonded on both the electronic components. An "unbonding process" must be used to separate the electronic components.

An example of a "readily demountable" connector is a rigid contact structure of one electronic component for insertion into a resilient socket of another electronic component. Another example of a "readily demountable" connector is spring-like contact structure of one electronic component for connecting to a terminal of another electronic component.

The spring-like contact structure, also known as an inter-connector, generally requires a certain amount of contact force to effect reliable pressure contact to a terminal of an electronic component. Therefore, the shape and metallurgy of the inter-connector are important factors in determining the effectiveness of the inter-connector for making pressure connection to the terminal of the electronic component.

U.S. Pat. No. 6,268,015 by Mathieu describes a method for making such an inter-connector. In Mathieu, lithographic and planarisation methods were used to "make" the inter-connectors in segments. The different segments of the inter-connector in Mathieu were sequentially "stacked" by deposition of a conductive material in a piece-meal manner. Therefore, the inter-connector in Mathieu is formed from discontinued segments having joints therebetween. Metallurgically, the joint stress due to joining a pair of inter-connector segments and stress concentration at the joints due forces applied to the inter-connector can lead to the mechanical failure of the inter-connector in Mathieu.

Another disclosed invention describes the use of a cavity to make an inter-connector formed from a single physically continuous segment of conductive material. The cavity described therein is a concavity having an opening. The cavity inwardly converges towards the base of the cavity. The conductive material is deposited into the opening for partially filling the cavity in a single step to form the inter-connector. However, the dimension and cross-sectional thickness formed using the disclosed method cannot be accurately or consistently controlled.

Hence, this clearly affirms a need for an inter-connector formation method for addressing the foregoing disadvantages of conventional methods for making inter-connectors.

SUMMARY

In accordance with a first aspect of the invention, there is disclosed an inter-connector formation method for forming a wafer-level inter-connector for use as an electro-mechanical inter-connector, the inter-connector formation method comprising the steps of:

forming a first passage in a first sacrificial layer of a first sacrificial material, the first sacrificial layer being formed over a portion of a substrate, the first passage extending from a signal terminal to an opening in the first sacrificial layer, and the signal terminal being formed on the substrate;

forming a protrusion over the opening in the first sacrificial layer, the protrusion being of a second sacrificial material and the second sacrificial material further extending from the protrusion to the signal terminal;

forming a second passage in a second sacrificial layer of the first sacrificial material, the second sacrificial layer being formed over a portion of the first sacrificial layer and the protrusion, the second passage extending from the protrusion to an opening in the second sacrificial layer;

removing the second sacrificial material to thereby remove the protrusion and to expose a structure channel extending from the signal terminal to the opening in the second sacrificial layer, and the structure channel defining the shape and dimension of the inter-connector; and depositing a structure material into the opening of the second sacrificial layer and thereby filling the structure channel therewith, the structure material taking the shape and dimension of the structure channel to form the inter-connector extending from the signal terminal to the opening in the second sacrificial layer.

In accordance with a second aspect of the invention, there is disclosed an inter-connector formation system for forming an inter-connector for use as an electro-mechanical connector, the inter-connector formation system comprising:

means for forming a first passage in a first sacrificial layer of a first sacrificial material, the first sacrificial layer being formed over a portion of a substrate, the first passage extending from a signal terminal to an opening in the first sacrificial layer, and the signal terminal being formed on the substrate;

means for forming a protrusion over the opening in the first sacrificial layer, the protrusion being of a second sacrificial material and the second sacrificial material further extending from the protrusion to the signal terminal;

means for forming a second passage in a second sacrificial layer of the first sacrificial material, the second sacrificial layer being formed over a portion of the first sacrificial layer and the protrusion, the second passage extending from the protrusion to an opening in the second sacrificial layer;

means for removing the second sacrificial material to thereby remove the protrusion and to expose a structure channel extending from the signal terminal to the opening in the second sacrificial layer, and the structure channel defining the shape and dimension of the inter-connector; and means for depositing a structure material into the opening of the second sacrificial layer and thereby filling the structure channel therewith, the structure material taking the shape and dimension of the structure channel to form the inter-connector extending from the signal terminal to the opening in the second sacrificial layer.

In accordance with a third aspect of the invention, there is disclosed an inter-connector formation method for forming an inter-connector for use as an electro-mechanical connector, the inter-connector formation method comprising the steps of:

forming a structure channel in a sacrificial layer of a sacrificial material, the sacrificial layer being formed over a portion of a substrate, the structure channel extending from a signal terminal to an opening in the sacrificial layer, and the signal terminal being formed on the substrate, and the structure channel defining the shape and dimension of the inter-connector; and depositing a structure material into the opening of the sacrificial layer and thereby filling the structure channel therewith, the structure material taking the shape and dimension of the structure channel to form the inter-connector extending from the signal terminal to the opening in the sacrificial layer, wherein the inter-connector comprises of at least a first elongated portion and a second elongated portion, one end of the first elongated portion being coincident with one end of the second elongated portion and the first elongated portion of the inter-connector being perpendicular to the second elongated portion of the inter-connector.

BRIEF DESCRIPTION OF THE DRAWINGS

Embodiments of the invention are described hereinafter with reference to the following drawings, in which.

DETAILED DESCRIPTION

An object representation method for addressing the foregoing problems is described hereinafter. The invention relates to an inter-connector formation method for forming an inter-connector, by lithographic techniques. The inter-connector is for use as an electro-mechanical connector. The electro-mechanical connector is for interconnecting electronic components, for example, a semi-conductor device, a memory chip, a chip carrier or a portion of a semiconductor wafer.

Figure 1:
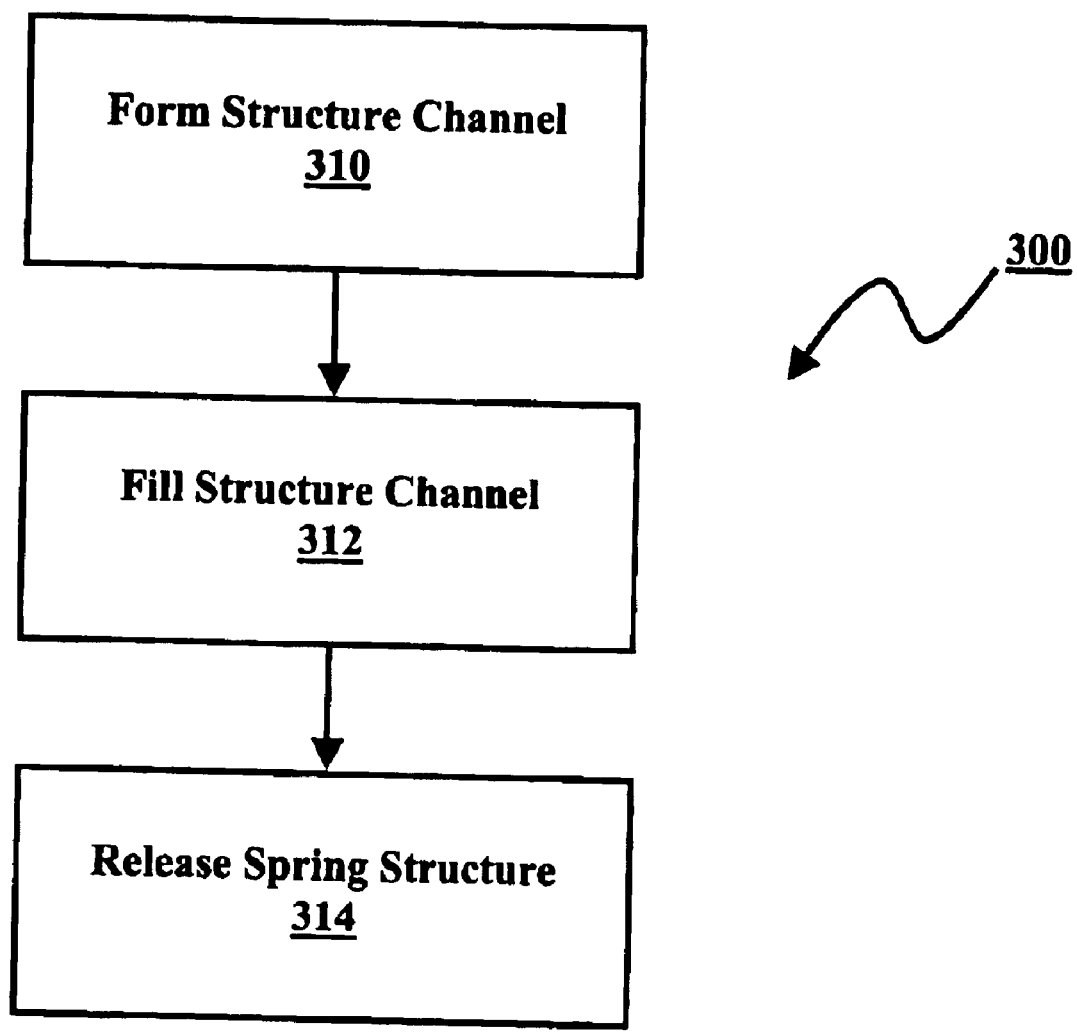
FIG. 1 shows a process flow diagram of an inter-connector formation method according to a first embodiment of the invention.

A first embodiment of the invention, an inter-connector formation method 300, as shown in FIG. 1, comprises of three main steps: forming a structure channel, filling the structure channel and freeing an inter-connector. The inter-connector formation method 300 is for forming an inter-connector 60 having a configuration as shown in FIG. 2.

Figure 2:
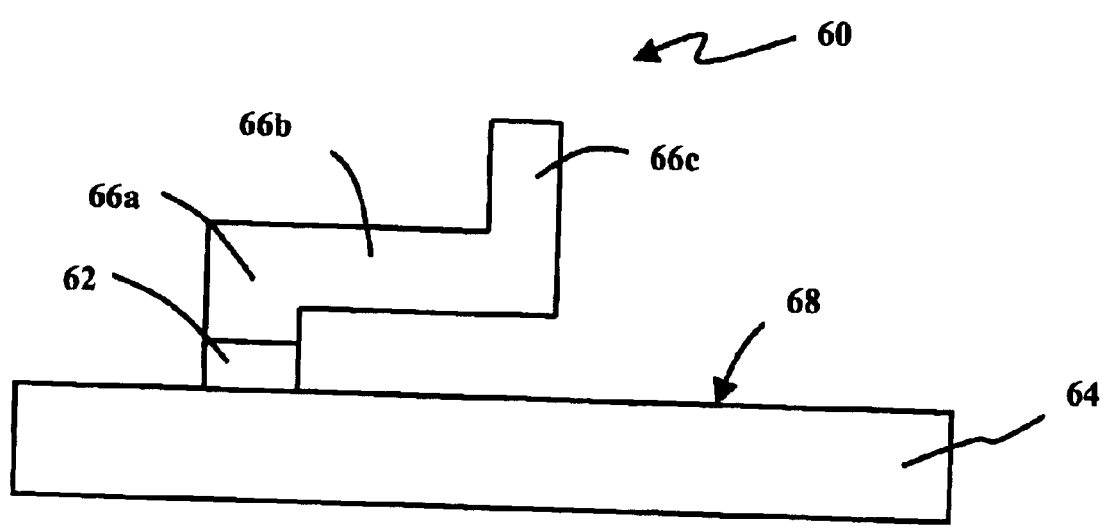
FIG. 2 shows a front view of an inter-connector formed by the inter-connector formation method of FIG. 1.

With reference to FIG. 2, the inter-connector 60 extends from a signal terminal 62 formed on a substrate 64. The substrate 64 is a panel on which integrated-circuits, printed circuits or the like electronic circuits with contact elements are formed onto. The signal terminals 62 are preferably one of copper (Cu), nickel (Ni) or gold (Au) terminal pads for connecting to one of the contact elements of the electronic circuits formed on the substrate 64.

The inter-connector 60 comprises of a post portion 66a, a beam portion 66b and a tip portion 66c. The inter-connector 60 initially extends substantially perpendicular to a mounting face 68 of the substrate 64 to form the post portion 66a, then generally parallel to the mounting face 68 of the substrate 64 to form the beam portion 66b, and subsequently, substantially perpendicular to the beam portion 66b to form the tip structure 66c.

The inter-connector 60 is resiliently biased and electrically conductive for interconnecting an electrical component and the substrate 64 and to enable electrical communication therebetween.

Figure 3:
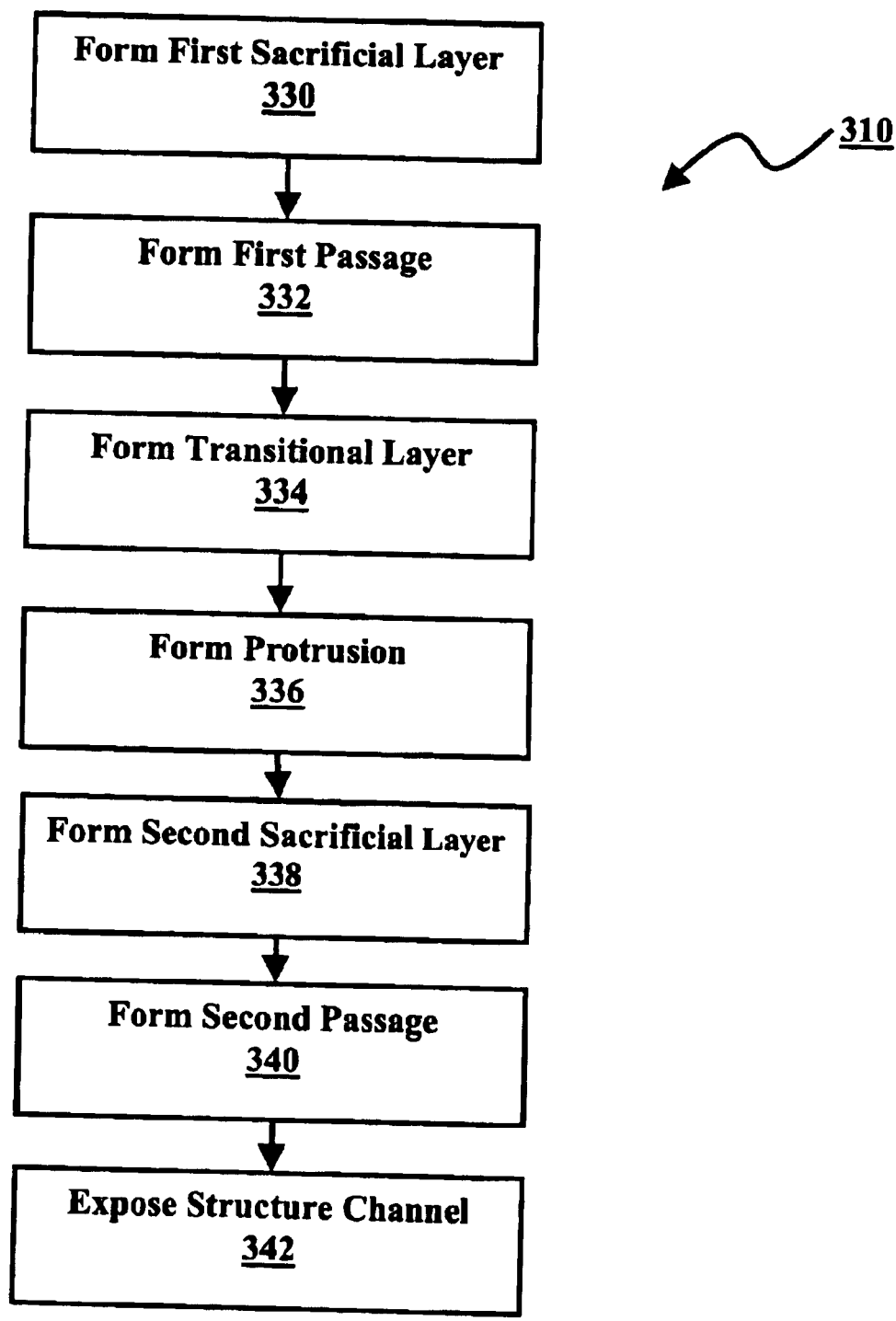
FIG. 3 shows a process flow diagram of a step of forming a structure channel in the inter-connector formation method of FIG. 1.
Figure 4:
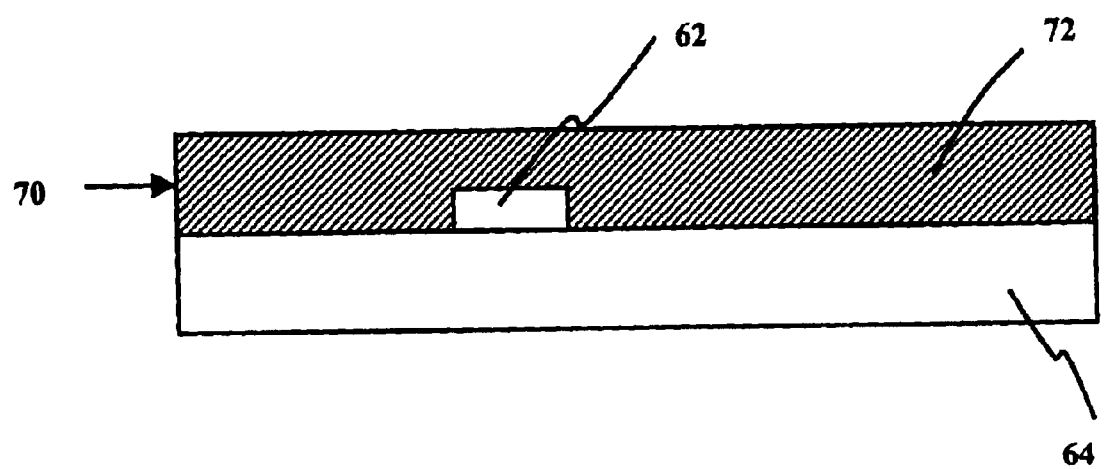
FIG. 4 shows a partial front sectional view of a substrate with a first sacrificial layer formed in the step of forming a structure channel in FIG. 3.
Figure 5:
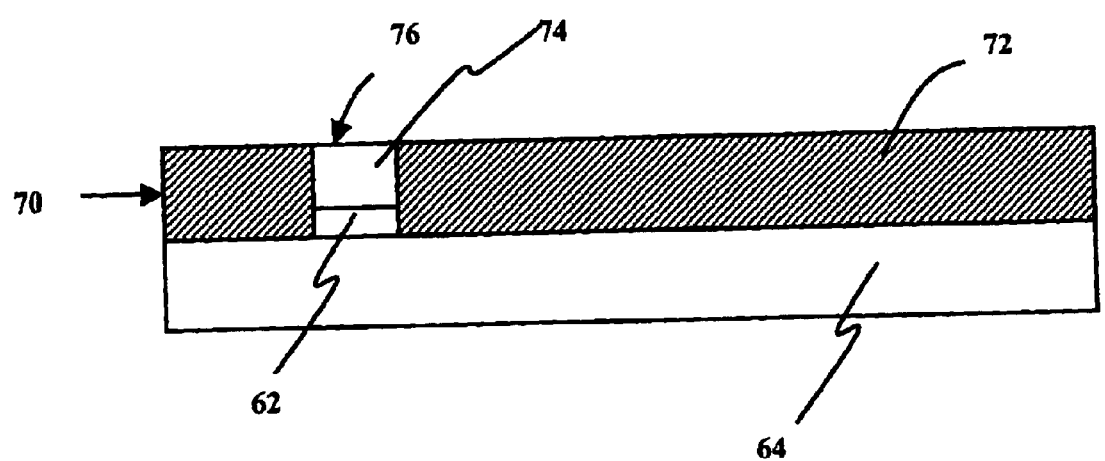
FIG. 5 shows a partial front sectional view of a substrate with a first passage formed in the step of forming a structure channel in FIG. 3.

The inter-connector 60 is formed over the substrate 64 using the inter-connector formation method 300 by first forming the structure channel in a step 310 of FIG. 1. FIG. 3 shows a process flow diagram of the step 310 of FIG. 1. In the step 310, a first sacrificial layer 70 is formed over the substrate 64 by depositing a first sacrificial material 72 over the substrate 64, as shown in FIG. 4, in a step 330. The first sacrificial layer 70 is patterned and a portion of the first sacrificial layer 70 is removed in a step 332 to form a first passage 74 as shown in FIG. 5. The first passage 74 extends from the signal terminal 62 to an opening 76. The first passage 74 is shaped and dimensioned according to the shape and dimension of the post portion 66a of the inter-connector 60 of FIG. 2.

Figure 6:
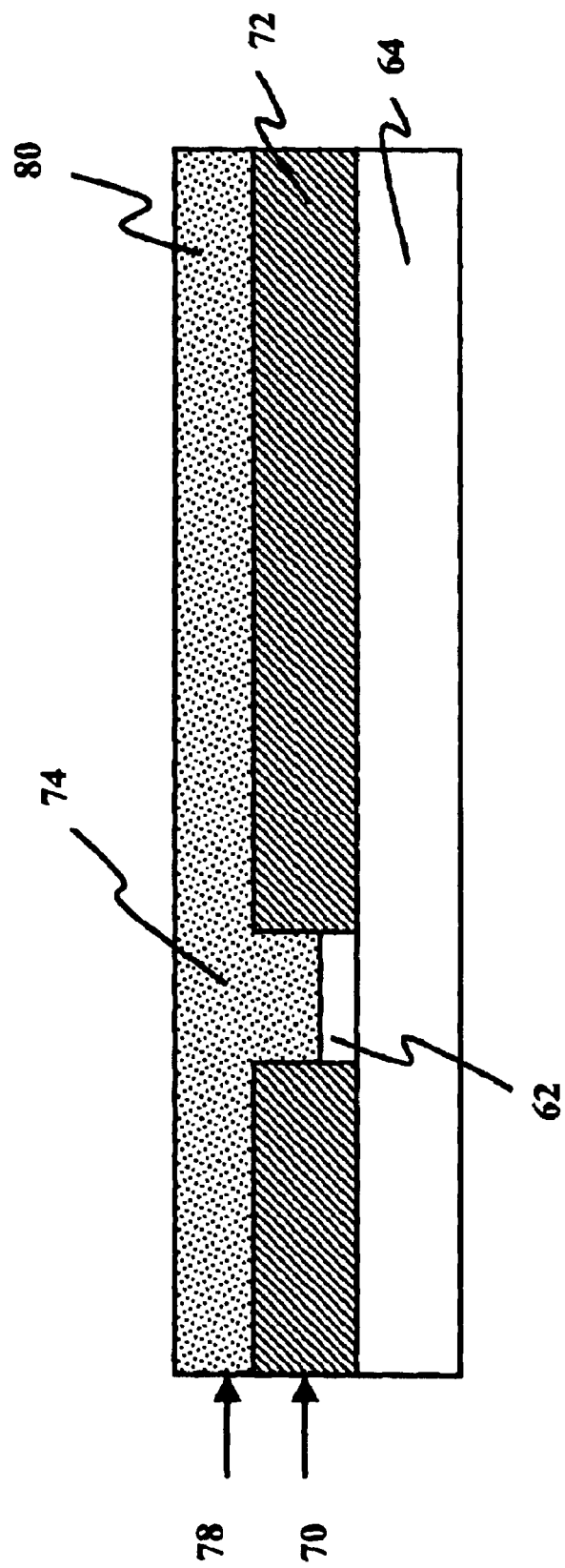
FIG. 6 shows a partial front sectional view of a substrate with a transitional layer formed in the step of forming a structure channel in FIG. 3.
Figure 7:
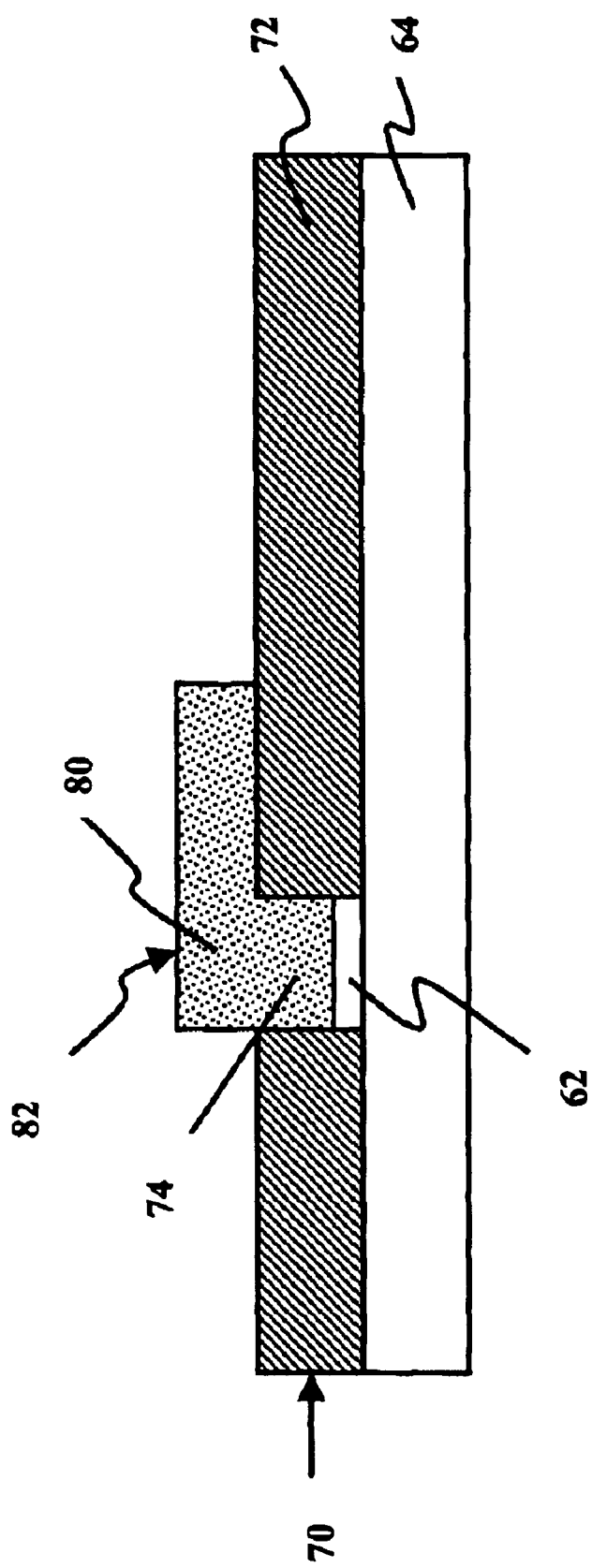
FIG. 7 shows a partial front sectional view of a substrate with a protrusion formed in the step of forming a structure channel in FIG. 3.

In a step 334 of FIG. 3, a second sacrificial material 78 is spin-coated onto the first sacrificial layer 70, thereby filling the first passage 74 and forming a transitional layer 78 over the first sacrificial layer 70 as shown in FIG. 6. In a step 336, the transitional layer 78 formed by the second sacrificial material 80 is patterned and a portion of the transitional layer 78 is removed to expose a protrusion 82 extending from the first sacrificial layer 70, as shown in FIG. 7, in a step 336. In the step 336, a portion of the first sacrificial layer 70 is exposed when the portion of the transitional layer 78 is removed. The protrusion 82 has the shape and dimension of the beam portion 66b of the inter-connector 60.

Figure 8:
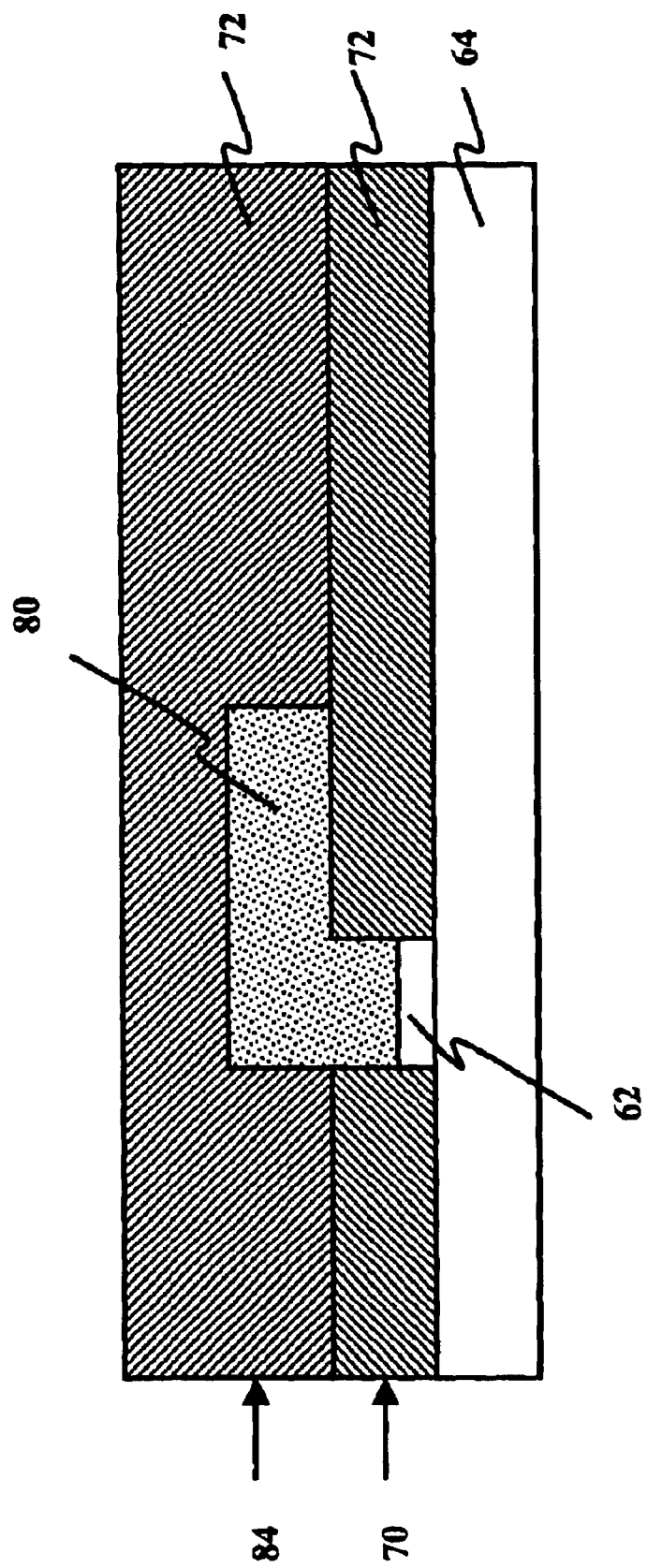
FIG. 8 shows a partial front sectional view of a substrate with a second sacrificial layer formed in the step of forming a structure channel in FIG. 3.
Figure 9:
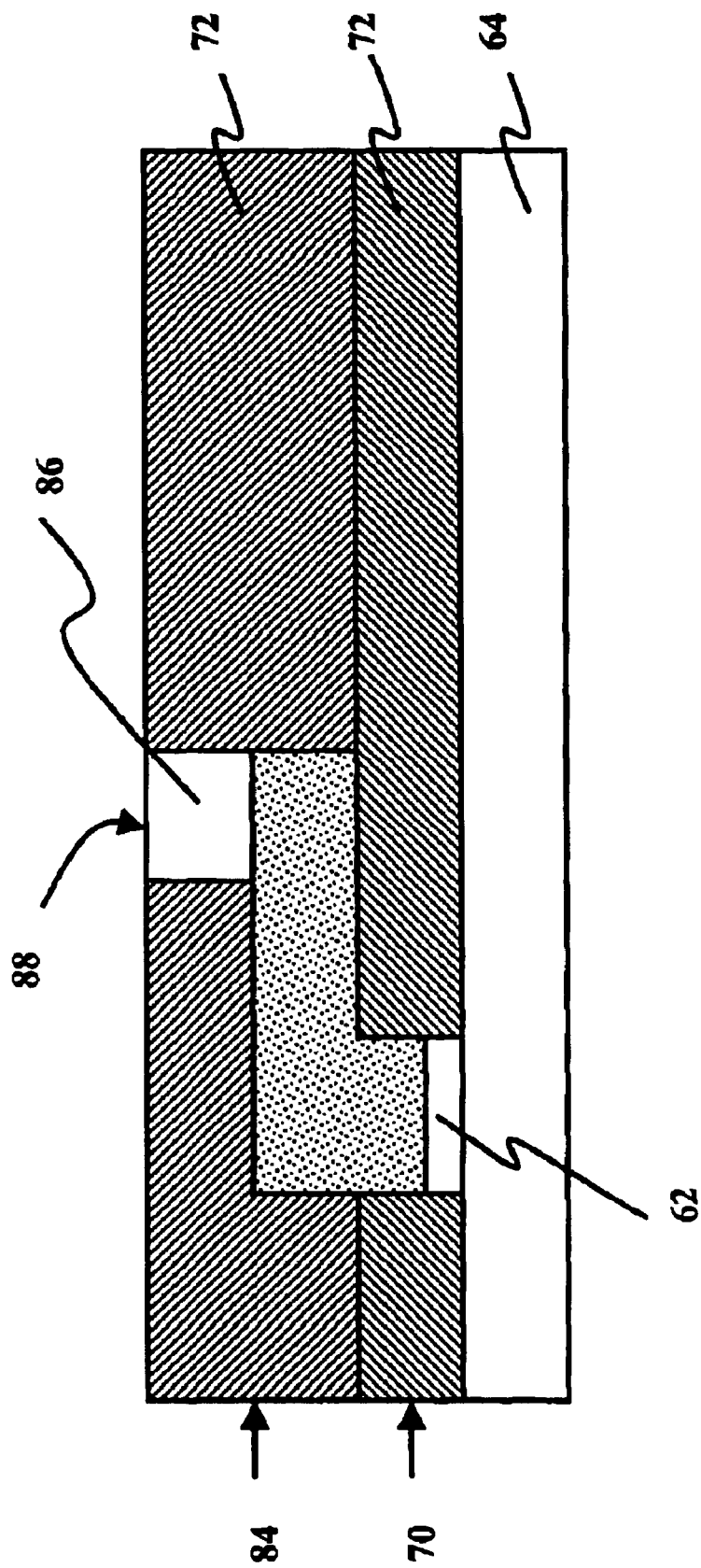
FIG. 9 shows a partial front sectional view of a substrate with a second passage formed in the step of forming a structure channel in FIG. 3.

As shown in FIG. 8, a second sacrificial layer 82 is then formed in a step 338 by spin-coating the second sacrificial material 80 over the first sacrificial layer 70 and the opening 76 of the first channel 74, with the second sacrificial material 80 filling the first channel 74. The second sacrificial layer 82 is then patterned and a portion of the second sacrificial layer 82 is removed in a step 340 to form a second passage 86 as shown in FIG. 9. The second passage 86 extends from the protrusion 82 to an opening 88 and has the shape and dimension of the tip portion 66c of the inter-connector 60.

The first sacrificial material 72 and the second sacrificial material 80 are polymer based. Each of the first sacrificial material 72 and the second sacrificial material 80 has a degradation temperature. The degradation temperature is the temperature at which the polymer-based material degrades. In the inter-connector formation method 200, the degradation temperature of the first sacrificial material 72 is higher than the degradation temperature of the second sacrificial material 80. Preferably, the degradation temperature of each of the first and second sacrificial materials 72/80 is 400° C. and 200° C. respectively.

Figure 10:
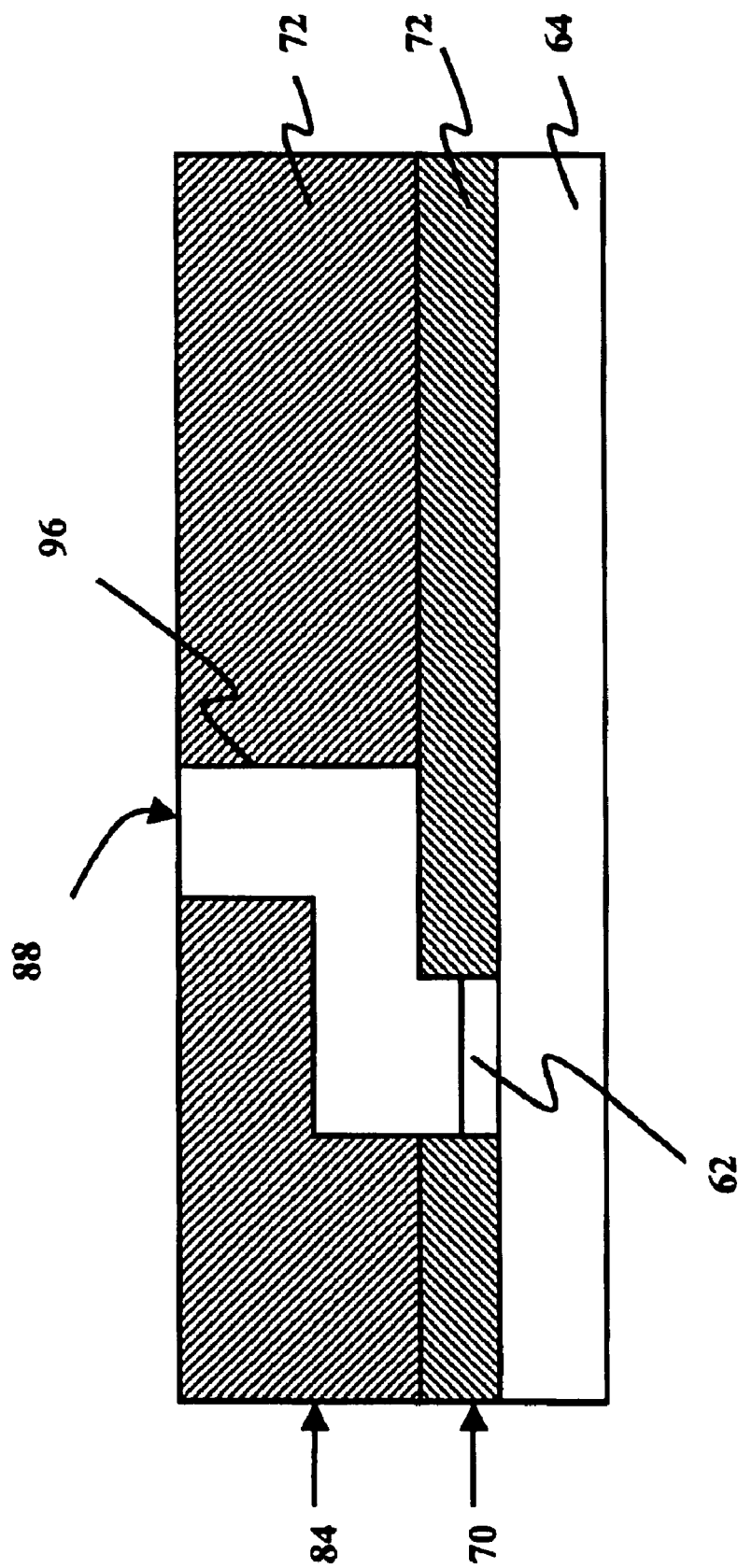
FIG. 10 shows a partial front sectional view of a substrate with a structure channel formed in the step of forming a structure channel in FIG. 3.

In the step 310, the substrate 64 is heat-treated at a temperature of generally 200° C. in a step 342. At 200° C., which is the degradation temperature of the second sacrificial material 80, the second sacrificial material 80 degrades to expose the structure channel 90, as shown in FIG. 10, and thereby completing the step 310.

In a step 312 of FIG. 1, a structure material 92 is deposited into the structure channel 90 through the opening 88. The structure material 92 is deposited using a suitable deposition technique chemical vapour deposition (CVD), sputter deposition, and electroless plating. The structure material 92 is electrically conductive and is preferably one of copper, nickel alloy or the like electrically conductive material.

Figure 11:
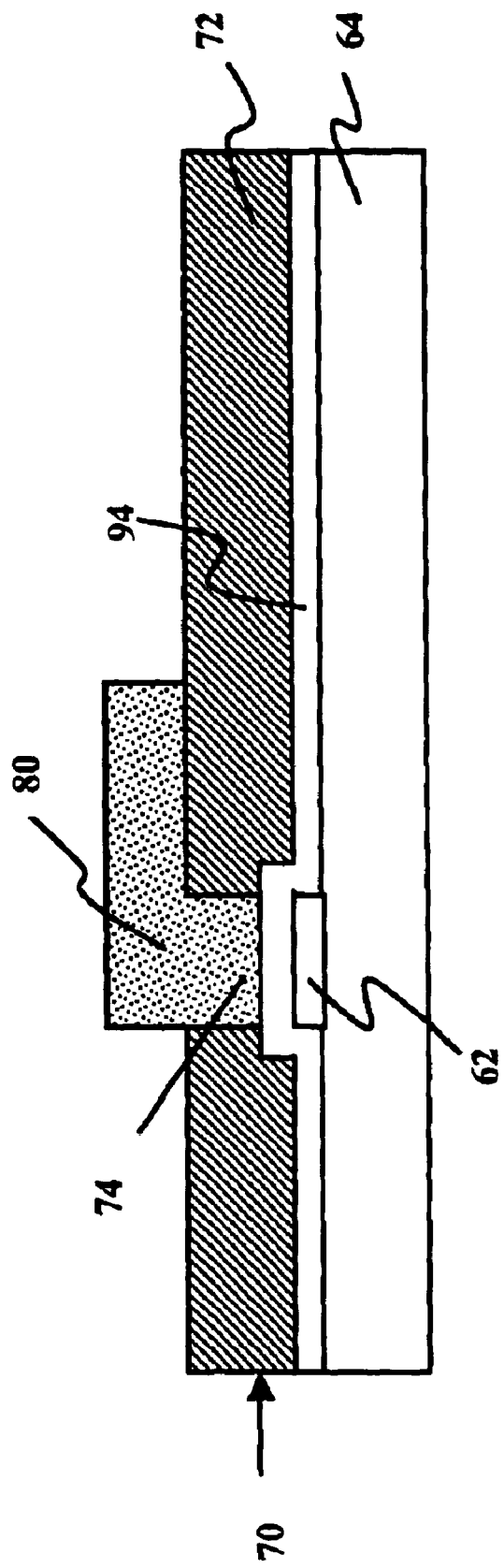
FIG. 11 shows a partial front sectional view of a substrate with a seed layer formed over the protrusion and the first sacrificial layer of FIG. 7 in the step of forming a structure channel in FIG. 3.

When electroplating is employed as the deposition technique, in the step 312, a seed layer 94 has to be formed below the first passage 74 is formed in the step 332. The seed layer 94, as shown in FIG. 11, is formed below the first sacrificial layer 70 with the seed layer 94 extending over the signal terminal 62.

Electroplating requires the structure material 92, for example nickel, copper, cobalt, palladium, nickel cobalt or the like electroplating structure material, to be applied in a form of a commercially available bath or solution. Therefore in the step 312, a current is applied between an anode (not shown) on the signal terminal 62, thereby creating negative charge build-up on the signal terminal 62. The negative charge build-up causes metal ions from the electroplating solution to be reduced to its metallic state and hence, depositing the nickel cobalt structure material onto the signal terminal 62 and filling the structure channel 90 in the process.

The structure material 92 deposited in the step 312, extends from the signal terminal 62 to the opening 88 of the second sacrificial material 80.

In a step 314 of FIG. 1, the inter-connector 60 is freed from the first sacrificial material 72 by heat-treating the first sacrificial material 72 at a temperature of generally 400° C. At 400° C., which is the degradation temperature of the first sacrificial material 72, the first sacrificial material degrades to expose the inter-connector as shown in FIG. 2.

Figure 12:
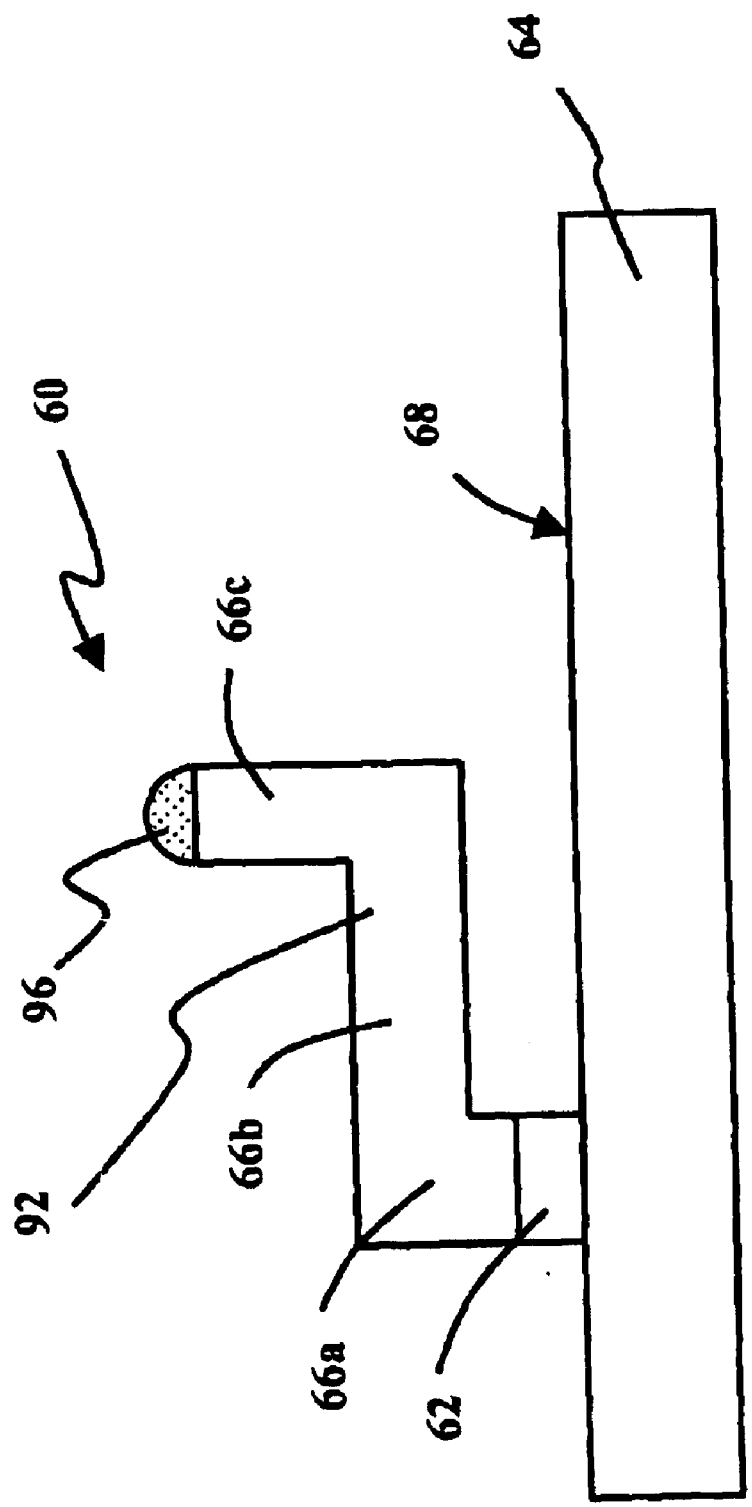
FIG. 12 shows a partial front sectional view of the inter-connector of FIG. 2 with a conductive bump formed on the free end thereof.

Further in the step 312, a bump 96 can be one of electroplated or deposited onto a free end 98 of the inter-connector 60. The bump 96 is electrically conductive. Following the formation of the bump 96, the step 314 exposes the inter-connector 60 as shown in FIG. 12.

Figure 13:
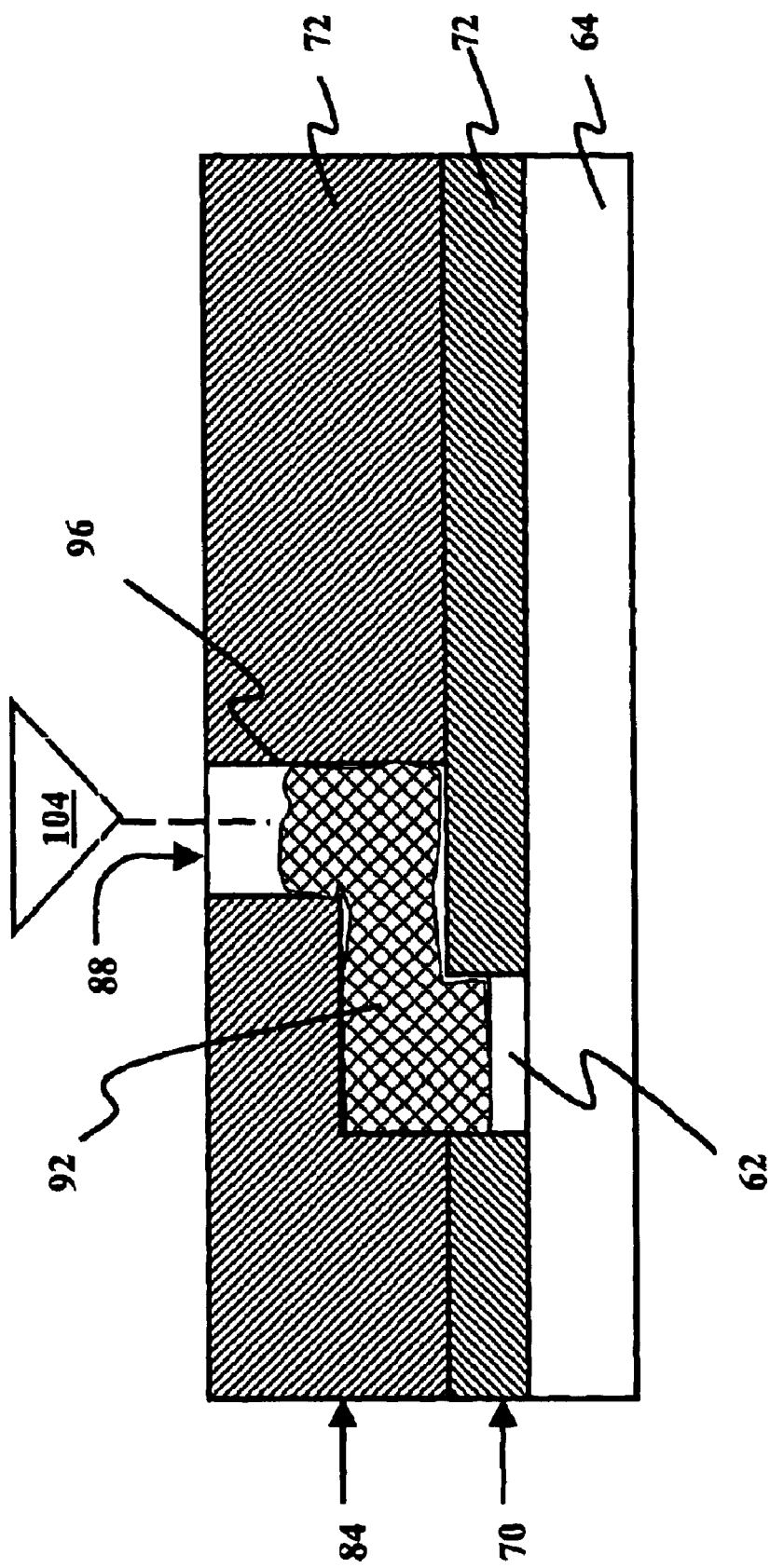
FIG. 13 shows a partial front sectional view of a substrate with the structure channel of FIG. 10 being filled with a structure material using a laser deposition device.

In the step 312, various methods can be employed for depositing the structure material 92 into the structure channel 90. A laser processing technique, as shown in FIG. 13, can be employed in the step 312 for depositing the structure material 92, a high temperature solder, into the structure channel 90. The laser processing technique is typically employed in a vacuum using a laser-based device 104.

Figure 14:
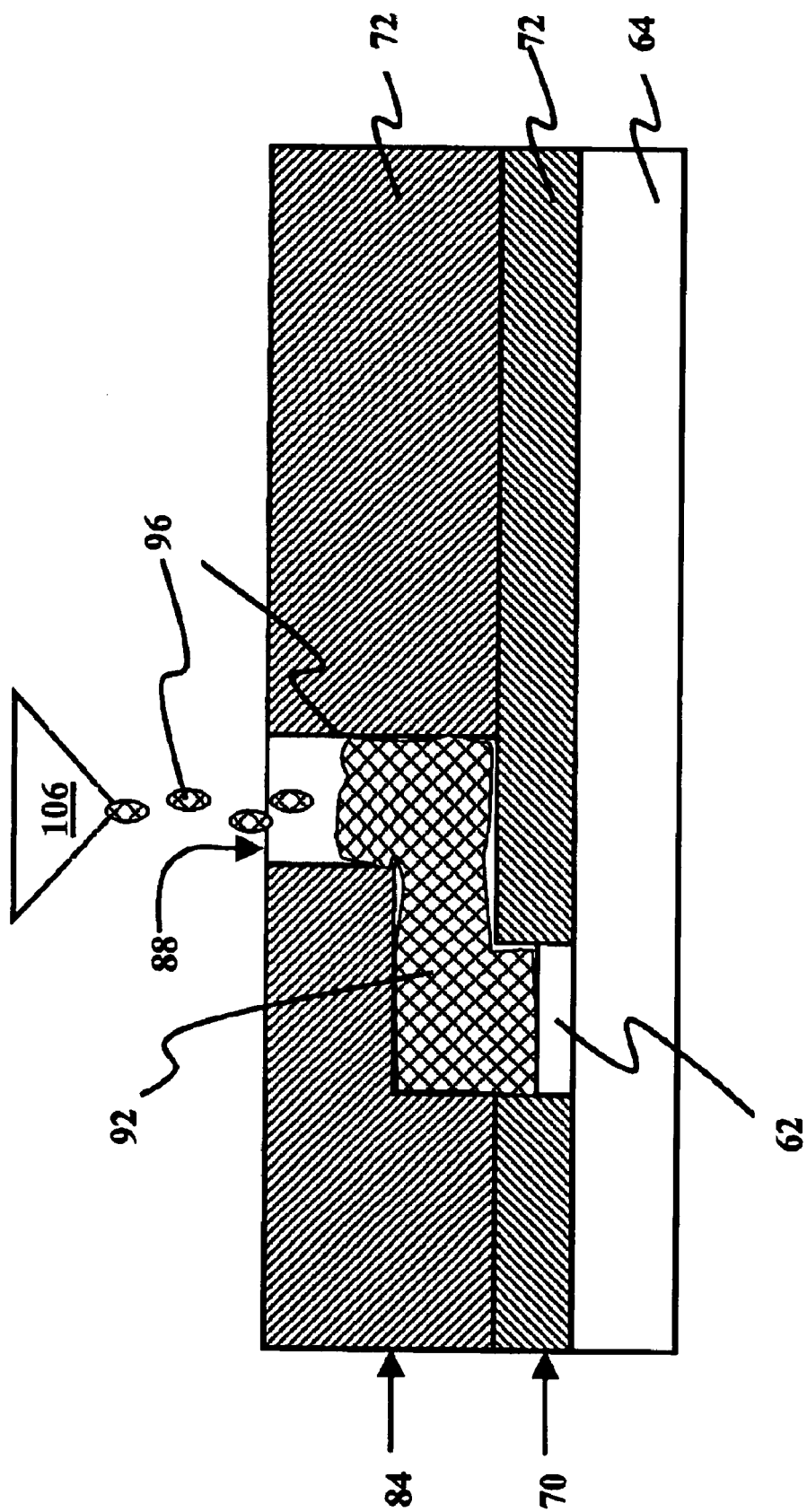
FIG. 14 shows a partial front sectional view of a substrate with the structure channel of FIG. 10 being filled with a structure material using an ink-jet deposition apparatus.
Figure 15:
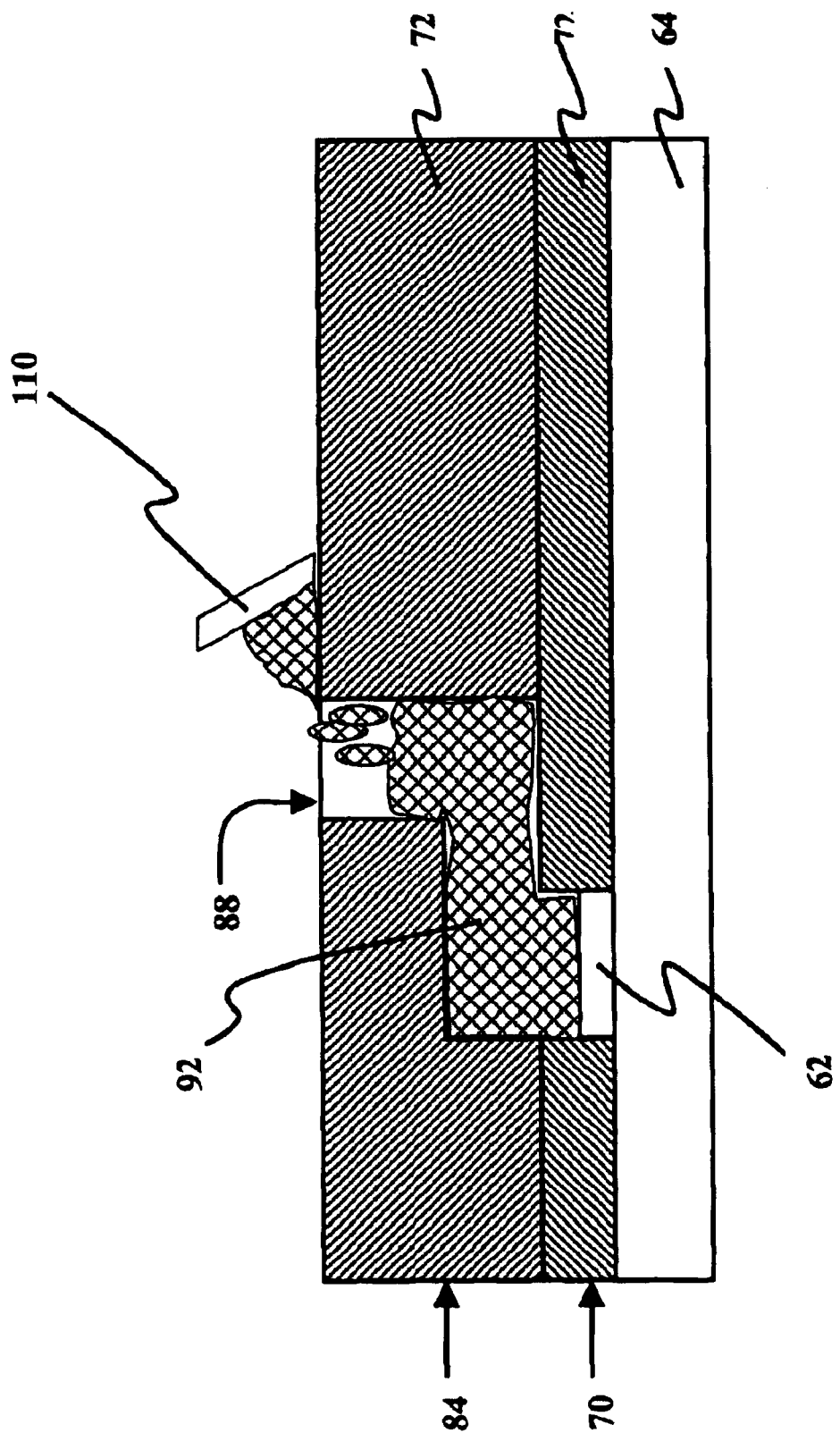
FIG. 15 shows a partial front sectional view of a substrate with the structure channel of FIG. 10 being filled with a structure material using a screen-printing assembly.

Alternatively, an ink-jet deposition apparatus 106, as shown in FIG. 14, can be used for depositing the structure material 92 into the structure channel 90. Besides using the ink-deposition apparatus, a screen-printing technique can be employed in the step 312. The screen-printing technique uses a screen-printing apparatus 110 for directing and thereby depositing the structure material 92 into the structure channel 90 as shown in FIG. 15.

Figure 16:
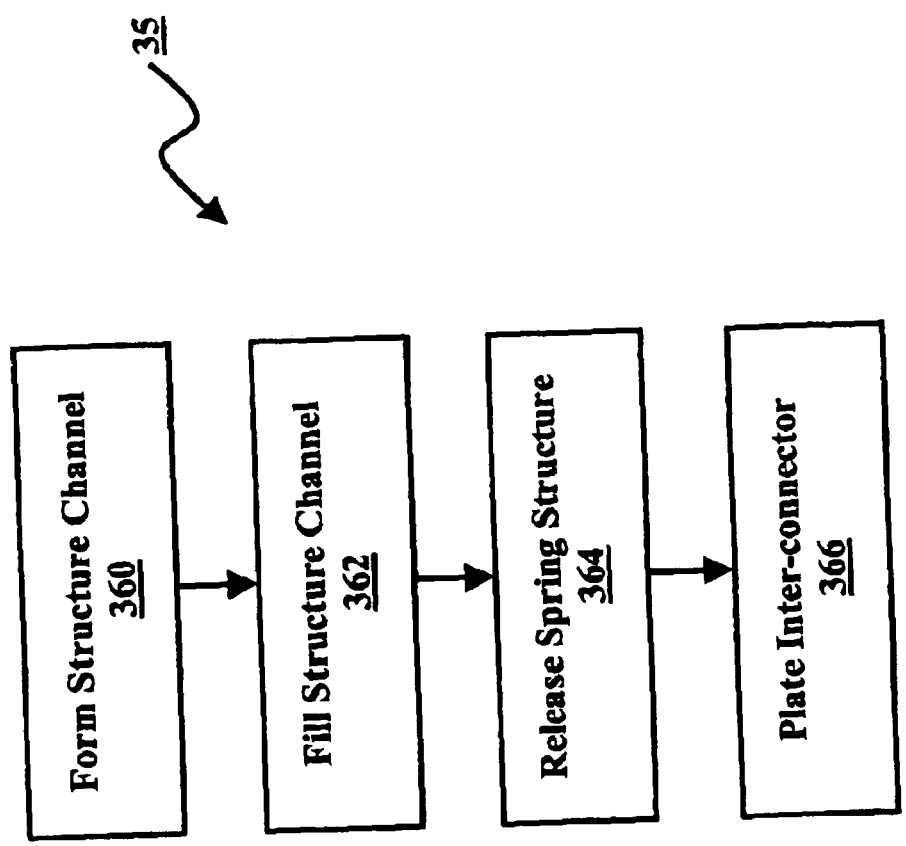
FIG. 16 shows a process flow diagram of an inter-connector formation method of FIG. 1 according to a second embodiment of the invention.

A second embodiment of the invention, an inter-connector formation method 350 as shown in FIG. 16, comprises of four main steps for forming an inter-connector 200: forming a structure channel, filling the structure channel, releasing an inter-connector and plating the inter-connector. The description in relation to steps 310, 312 and 314 described in the first embodiment of the invention with reference to FIG. 1 are incorporated herein as steps 360, 362 and 364 respectively.

Figure 17:
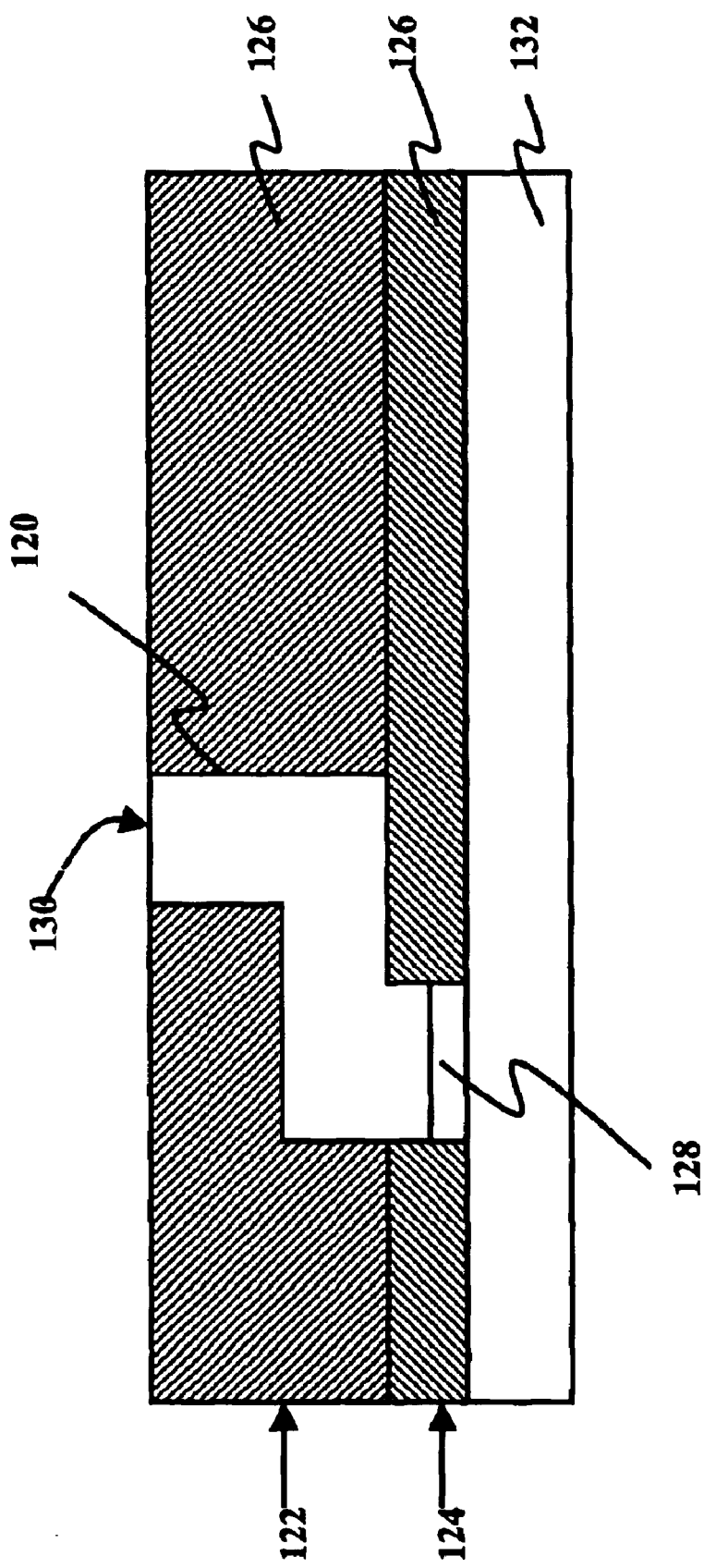
FIG. 17 shows a partial front sectional view of a substrate with a structure channel formed in accordance with the second embodiment of the inter-connector formation method of FIG. 16.

In the step 360, a structure channel 120 is formed in a first sacrificial layer 122 and a second sacrificial layer 124 as shown in FIG. 17. Both the first sacrificial layer 122 and the second sacrificial layer 124 are formed from a first sacrificial material 126. The structure channel 120 extends from a signal terminal 128 to an opening 130, with the signal terminal 128 being formed on a substrate 132.

Figure 18:
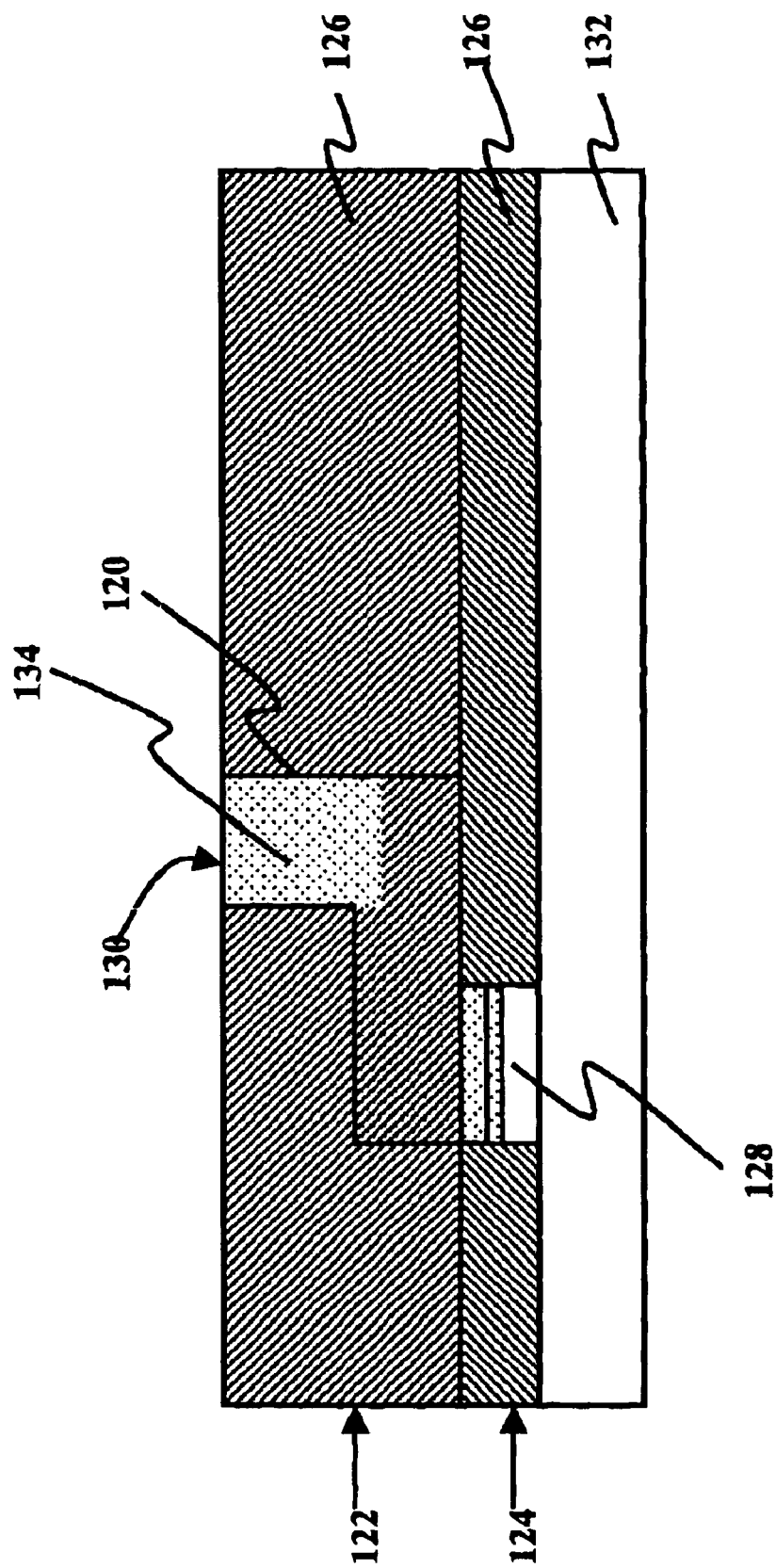
FIG. 18 shows a partial front sectional view of a substrate with the structure channel of FIG. 17 being filled with a structure material.

Following the step 360, the structure channel 120 is filled with a structure material 134 in a step 362 as shown in FIG. 18. Each of the structure material 134 and the first sacrificial material 126 has a degradation temperature with the degradation temperature of the structure material 134 being higher than the degradation temperature of the first sacrificial material 126.

Figure 19:
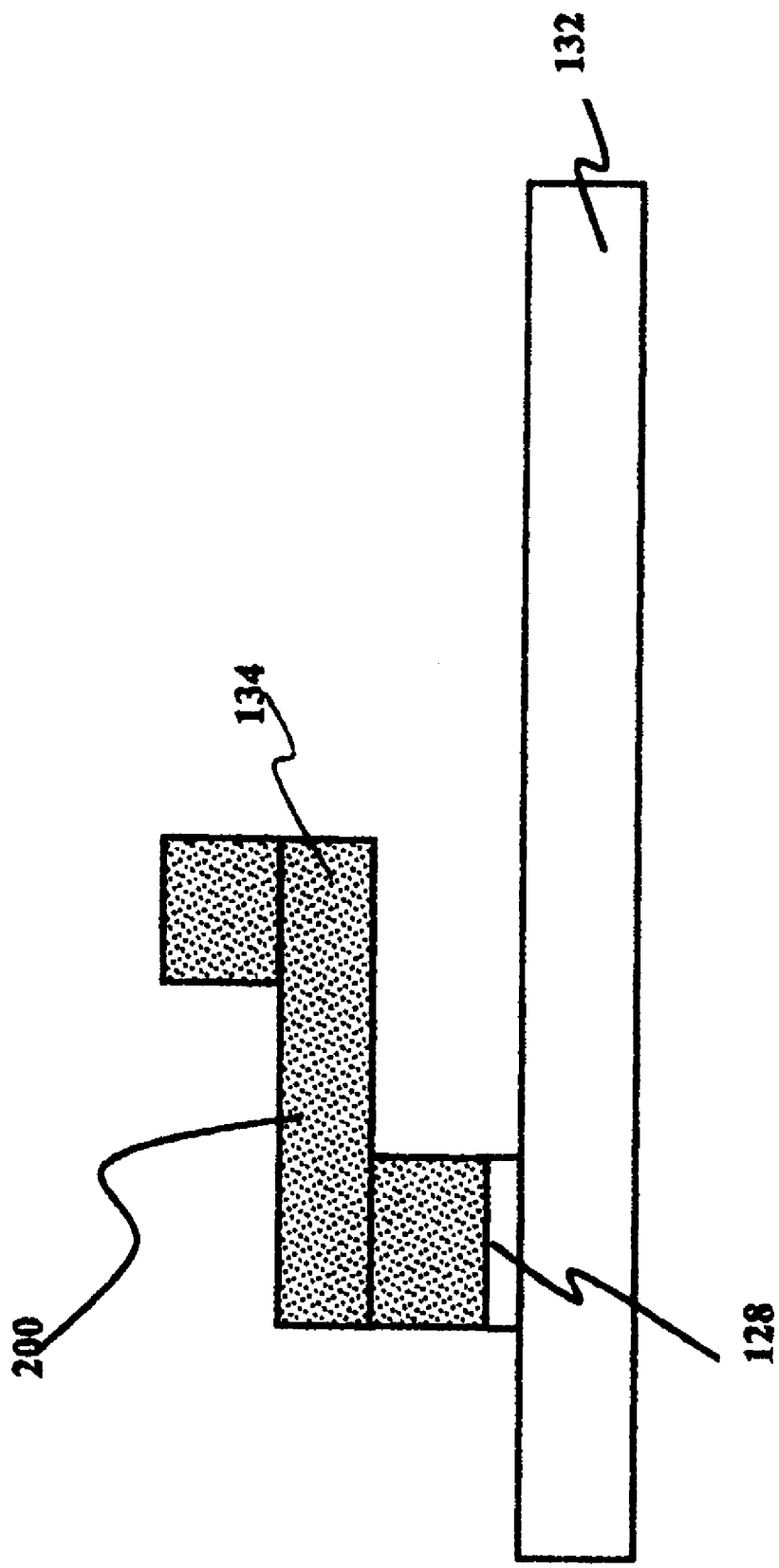
FIG. 19 shows a partial front sectional view of an inter-connector formed with a structure material in accordance with the second embodiment of the inter-connector formation method of FIG. 16.

In the step 364 of FIG. 16, the inter-connector 200 is freed from the first sacrificial material 126 by heat-treating the first sacrificial layer 124 and the second sacrificial layer 126 at the degradation temperature of the first sacrificial material 126. The first sacrificial material 126 degrades after heat treatment to free the structure material 134 and therefore the inter-connector 200 as shown in FIG. 19.

The structure material 134 is preferably polymer-based and having polymeric and structural properties to impart biased resiliency to the inter-connector 200. Alternatively, one of a composite material or a nano-material is used as the structure material 134. The nano-material, for example nano-copper, is used for its enhanced mechanical properties.

Figure 20:
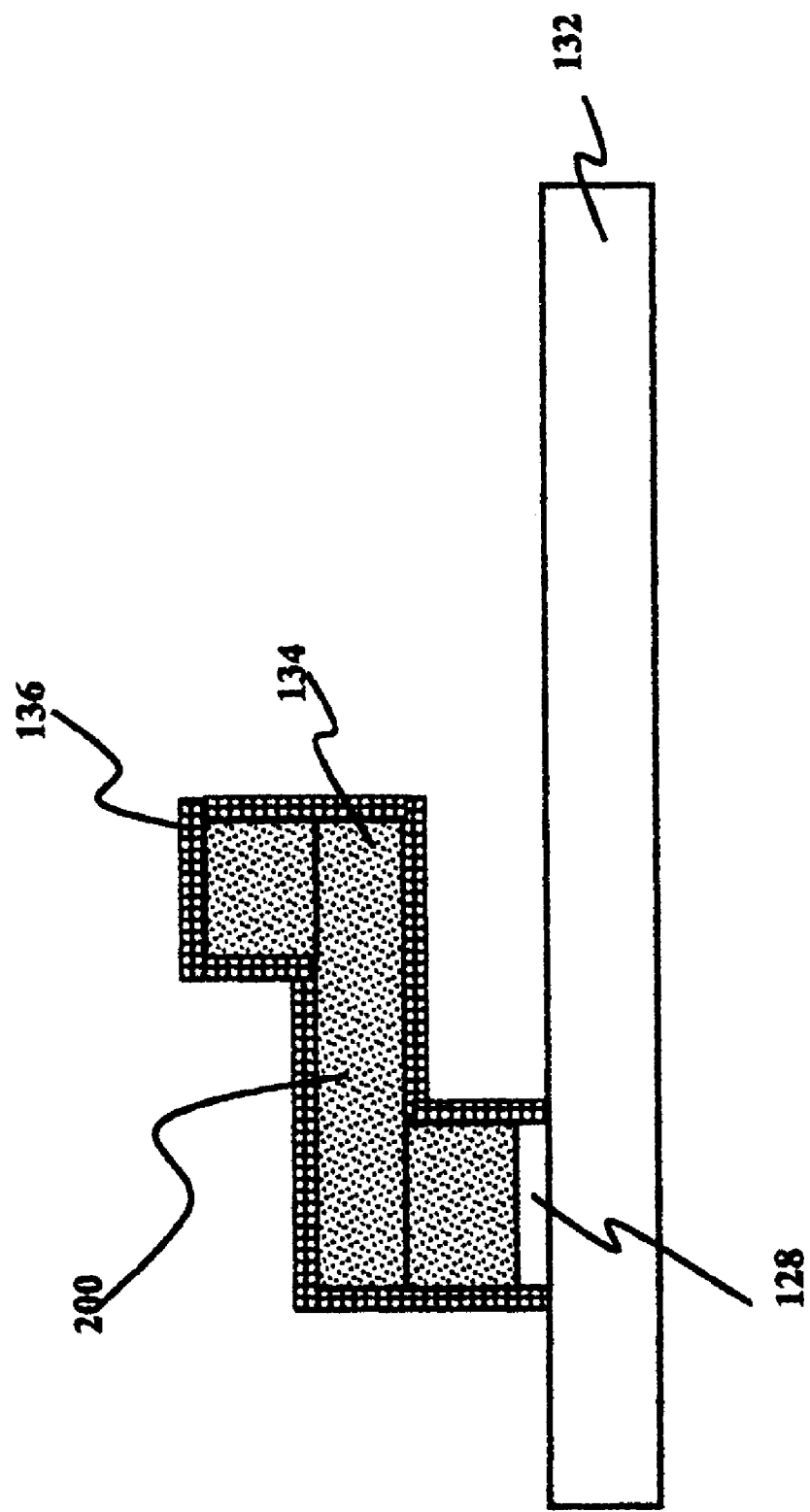
FIG. 20 shows a partial front sectional view of the inter-connector of FIG. 19 with the structure material being plated with a plating material.
Figure 21:
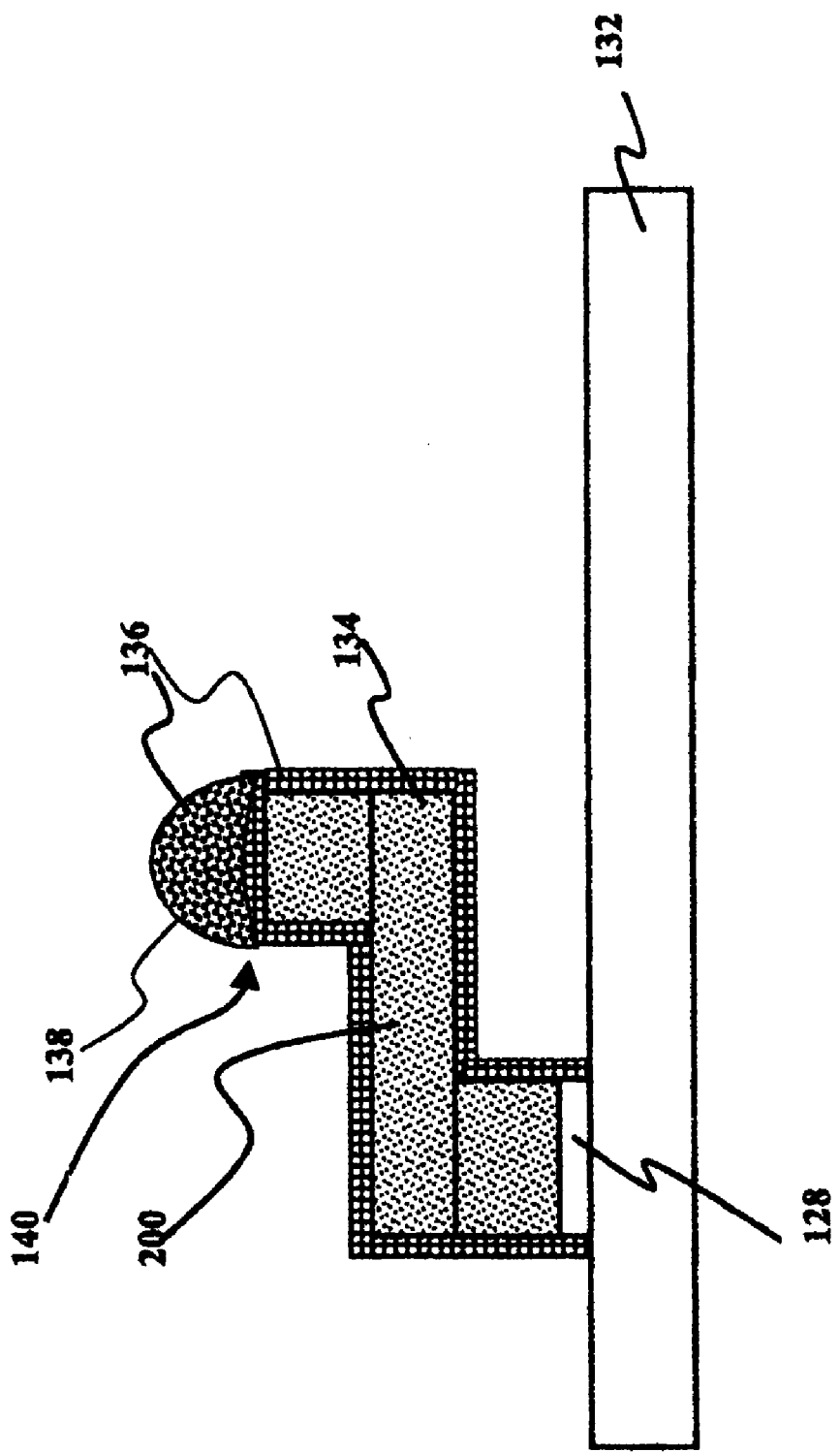
FIG. 21 shows a partial front sectional view of the inter-connector of FIG. 21 with a conductive bump being formed on the free-end thereof.

Following the step 364, the inter-connector 200 is electroplated with a plating material 136 in a step 366 as shown in FIG. 20. The plating material 136 plated onto the inter-connector 200 is electrically conductive and in electrical communication with the signal terminal 128.

Further in the step 366, a bump 138 can be one of electroplated or deposited onto a free end 140 of the inter-connector 200. The bump 140 is electrically conductive. In the second embodiment of the inter-connector formation method 350, the inter-connector 200 formed from both the structure material 134 and the plating material 136. This enables both the structure material 134 and the plating material 136 to perform decoupled functions with the structure material 134 providing the structural support and biased resiliency and the plating material 136 providing electrical conductivity. By using the polymer-based structure material 134, the need and dependency on metals for producing inter-connectors 200 are substantially reduced.

In the foregoing manner, an inter-connector formation method for forming an inter-connector for use as an electro-mechanical inter-connector is described according to two embodiments of the invention for addressing the foregoing disadvantages of conventional methods for forming inter-connectors. Although only two embodiments of the invention is disclosed, it will be apparent to one skilled in the art in view of this disclosure that numerous changes and/or modification can be made without departing from the scope and spirit of the invention.

What is claimed is:

1. An inter-connector formation method for forming an inter-connector for use as an electro-mechanical connector, the inter-connector formation method comprising the steps of:

forming a first passage in a first sacrificial layer of a first sacrificial material, the first sacrificial layer being formed over a portion of a substrate, the first passage extending from a signal terminal to an opening in the first sacrificial layer, and the signal terminal being formed on the substrate;

forming a protrusion over the opening in the first sacrificial layer, the protrusion being of a second sacrificial material and the second sacrificial material further extending from the protrusion to the signal terminal;

forming a second passage in a second sacrificial layer of the first sacrificial material, the second sacrificial layer being formed over a portion of the first sacrificial layer and the protrusion, the second passage extending from the protrusion to an opening in the second sacrificial layer;

removing the second sacrificial material to thereby remove the protrusion and to expose a structure channel extending from the signal terminal to the opening in the second sacrificial layer, and the structure channel defining the shape and dimension of the inter-connector; and depositing a structure material into the opening of the second sacrificial layer and thereby filling the structure channel therewith, the structure material taking the shape and dimension of the structure channel to form the inter-connector extending from the signal terminal to the opening in the second sacrificial layer.

2. The inter-connector formation method as in claim 1, further comprising a step of removing the first sacrificial material to expose the inter-connector.

3. The inter-connector formation method as in claim 1, the step of forming a first passage in a first sacrificial layer comprising the steps of:

coating a portion of a surface of the substrate with the first sacrificial material to form the first sacrificial layer;

patterning the first sacrificial layer to define the opening in the first sacrificial layer; and removing a portion of the first sacrificial layer to form the first passage, the first passage exposing a portion of the signal terminal.

4. The inter-connector formation method as in claim 1, the step of forming a protrusion over the opening of the first sacrificial layer comprising the steps of:

coating a portion of a surface of the first sacrificial layer with the second sacrificial material and thereby filling the first passage with the second sacrificial material to form a transitional layer;

patterning the transitional layer to define the protrusion; and removing a portion of the transitional layer to form the protrusion and expose a portion of the first sacrificial layer.

5. The inter-connector formation method as in claim 1, the step of forming a second passage in a second sacrificial layer comprising the steps of:
   coating a portion of a surface of the first sacrificial layer and the protrusion with the first sacrificial material to form the second sacrificial layer;
   patterning the second sacrificial layer to define the opening in the second sacrificial layer; and
   removing a portion of the second sacrificial layer to form the second passage.

6. The inter-connector formation method as in claim 1, the step of forming a first passage in a first sacrificial layer of a first sacrificial material comprising a step of:
   providing the first sacrificial material for the first sacrificial layer, the first sacrificial material being polymer-based and having a degradation temperature.

7. The inter-connector formation method as in claim 6, the step of forming a protrusion over opening of the first sacrificial layer:
   providing the second sacrificial material for forming the protrusion, the second sacrificial material being polymer-based and having a degradation temperature.

8. The inter-connector formation method as in claim 7, the step of providing the second sacrificial material comprising a step of:
   providing the second sacrificial material with the degradation temperature thereof being lower than the degradation temperature of the first sacrificial material.

9. The inter-connector formation method as in claim 8, the step of removing the second sacrificial material to expose a structure channel comprising a step of:
   heat-treating the second sacrificial material at the degradation temperature thereof.

10. The inter-connector formation method as in claim 1, the step of depositing a structure material into the opening of the second sacrificial comprising a step of:
    plating the structure channel with the structure material.

11. The inter-connector formation method as in claim 9, the step of forming a first passage in a first sacrificial layer comprising a step of:
    forming a seed layer between the first sacrificial layer and the substrate, the seed layer being conductive and formed over the signal terminal.

12. The inter-connector formation method as in claim 11, the step of depositing a structure material into the opening of the second sacrificial comprising a step of:
    electro-plating the structure channel with the structure material by initiating a charge build-up on the signal terminal.

13. The inter-connector formation method as in claim 2, the step of removing the first sacrificial material to expose the inter-connector comprising a step of:
    heat-treating the first sacrificial material at the degradation temperature thereof, the first sacrificial material and the second sacrificial material being polymer-based and each of the first and second sacrificial material having a degradation temperature, wherein the degradation temperature of the first sacrificial material is higher than the degradation temperature of the second sacrificial material.

14. The inter-connector formation method as in claim 1, the step of depositing a structure material into the opening of the second sacrificial layer to form the inter-connector comprising a step of:
    forming a resiliently biased inter-connector.

15. The inter-connector formation method as in claim 1, the step of depositing a structure material into the opening of the second sacrificial layer to form the inter-connector comprising a step of:
    forming the inter-connector with a cantilever configuration, the inter-connector having a fixed end attached to the signal terminal of the substrate and a free end.

16. The inter-connector formation method as in claim 1, the step of depositing a structure material into the opening of the second sacrificial layer to form the inter-connector comprising a step of:
    depositing a conductive structure material.

17. The inter-connector formation method as in claim 16, further comprising a step of:
    forming a conductive stub at the free end of the inter-connector.

18. The inter-connector formation method as in claim 17, the step of forming a conductive stub comprising the steps of:
    plating a conductive material onto the free end of the inter-connector; and
    removing a portion of the conductive material to form the conductive stub at the free end of the inter-connector.

19. The inter-connector formation method as in claim 1, the step of depositing a structure material into the opening of the second sacrificial layer to form the inter-connector comprising a step of:
    depositing a structure material into the opening of the second sacrificial layer using a deposition method selected from the group consisting of laser deposition, ink-jet deposition and screen printing.

20. The inter-connector formation method as in claim 2, the step of depositing a structure material into the opening of the second sacrificial layer comprising a step of:
    depositing a polymer-based structure material into the opening of the second sacrificial layer.

21. The inter-connector formation method as in claim 2, the step of depositing a structure material into the opening of the second sacrificial layer comprising a step of:
    depositing a composite material into the opening of the second sacrificial layer.

22. The inter-connector formation method as in claim 2, the step of depositing a structure material into the opening of the second sacrificial layer comprising a step of:
    depositing a nano-material into the opening of the second sacrificial layer.

23. The inter-connector formation method as in claim 20, the step of removing the first sacrificial material to expose the inter-connector comprising a step of:
    removing the first sacrificial material to expose a resiliently biased inter-connector.

24. The inter-connector formation method as in claim 20, further comprising a step of:
    coating the inter-connector with a conductive material, the conductive material being in electrical communication with the signal terminal.

25. The inter-connector formation method as in claim 24, the step of coating the inter-connector with a conductive method comprising a step of:

coating the inter-connector using a coating method selected from the group consisting of electroplating and electroless-plating.

26. An inter-connector formation system for forming an inter-connector for use as an electro-mechanical connector, the inter-connector formation system comprising:

means for forming a first passage in a first sacrificial layer of a first sacrificial material, the first sacrificial layer being formed over a portion of a substrate, the first passage extending from a signal terminal to an opening in the first sacrificial layer, and the signal terminal being formed on the substrate;

means for forming a protrusion over the opening in the first sacrificial layer, the protrusion being of a second sacrificial material and the second sacrificial material ether extending from the protrusion to the signal terminal;

means for forming a second passage in a second sacrificial layer of the first sacrificial material, the second sacrificial layer being formed over a portion of the first sacrificial layer and the protrusion, the second passage extending from the protrusion to an opening in the second sacrificial layer;

means for removing the second sacrificial material to thereby remove the protrusion and to expose a structure channel extending from the signal terminal to the opening in the second sacrificial layer, and the structure channel defining the shape and dimension of the inter-connector; and means for depositing a structure material into the opening of the second sacrificial layer and thereby filling the structure channel therewith, the structure material taking the shape and dimension of the structure channel to form the inter-connector extending from the signal terminal to the opening in the second sacrificial layer.

27. The inter-connector formation system as in claim 26, further comprising the means for removing the first sacrificial material to expose the inter-connector.

28. An inter-connector formation method for forming an inter-connector for use as an electro-mechanical connector, the inter-connector formation method comprising the steps of:

forming a structure channel in a sacrificial layer of a sacrificial material, the sacrificial layer being formed over a portion of a substrate, the structure channel extending from a signal terminal to an opening in the sacrificial layer, and the signal terminal being formed on the substrate, and the structure channel defining the shape and dimension of the inter-connector; and depositing a structure material into the opening of the sacrificial layer and thereby filling the structure channel therewith, the structure material taking the shape and dimension of the structure channel to form the inter-connector extending from the signal terminal to the opening in the sacrificial layer, wherein the inter-connector comprises of at least a first elongated portion and a second elongated portion, one end of the first elongated portion being coincident with one end of the second elongated portion and the first elongated portion of the inter-connector being perpendicular to the second elongated portion of the inter-connector.

29. The inter-connector formation method as in claim 26, further comprising a step of removing the sacrificial material to expose the inter-connector, the inter-connector having a cantilever configuration and the inter-connector connector being resiliently biased and electrically conductive.

* * * * *